METHOD OF MANUFACTURING SEMI-CONDUCTOR CRYSTALS

Filed June 28, 1956

ROBERT G. POHL
*INVENTOR.*

BY Francis W. Crotty

HIS ATTORNEY.

United States Patent Office 2,852,420
Patented Sept. 16, 1958

2,852,420

METHOD OF MANUFACTURING SEMI-CONDUCTOR CRYSTALS

Robert G. Pohl, Chicago, Ill., assignor to The Rauland Corporation, a corporation of Illinois Application June 28, 1956, Serial No. 594,581

8 Claims. (Cl. 148—1.5)

Figure 1:
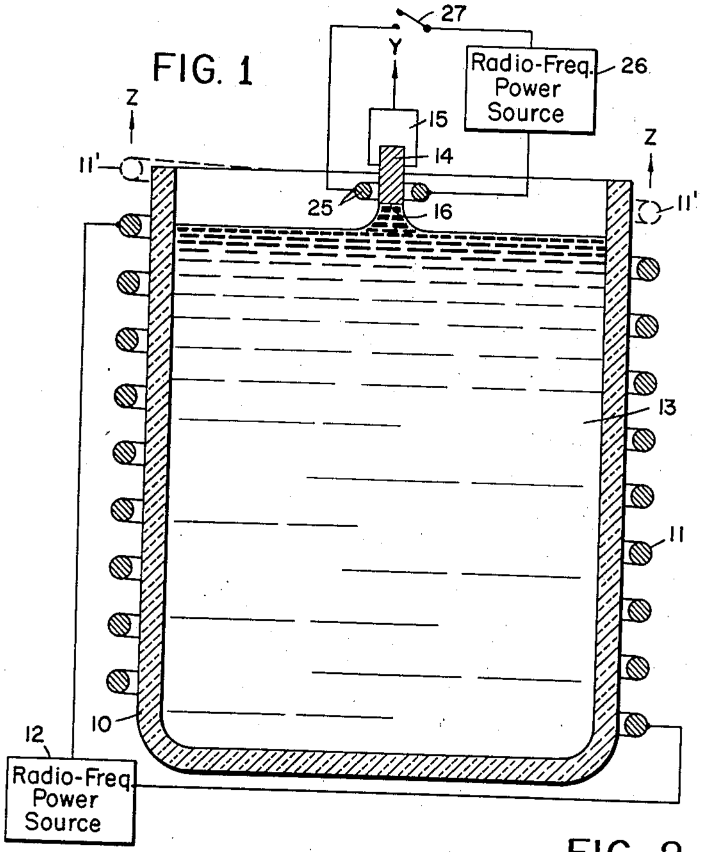

This invention relates to a new and improved method of manufacturing semi-conductor crystals. More particularly, the invention is directed to a new and improved process for producing metallic semi-conductor crystals having contiguous zones exhibiting different types of electrical conductivity for use in the manufacture of junction-type transistors, diodes and similar devices. This application is a continuation-in-part of now abandoned copending application Serial No. 476,291, filed December 20, 1954, for "Method of Manufacturing Semi-Conductor Crystals," and assigned to the present assignee.

Semi-conductor devices may be employed for a wide variety of purposes in electrical networks; for example, devices of this type may be utilized as rectifiers, detectors, amplifiers, etc. Many of these devices are characterized by composite structures which include adjacent semi-conductor layers, usually germanium or silicon, having different types of conductivity. In one form of semi-conductor material, conductivity is theoretically considered to result from the migration of positive charges or "holes"; this type of semi-conductor is generally referred to as having "p-type" conductivity. The other general form of semi-conductive material, normally referred to as "n-type," conducts electrical currents primarily by means of the movement or migration of negative charges or electrons.

Three different methods have heretofore been utilized for producing p-n junctions as used in diodes and junction transistors. In one of these processes, known as the alloy process, an "acceptor" modifier element such as indium or gallium is placed upon the surface of an n-type semi-conductor crystal and is heated so that some of the acceptor is diffused into the surface portion of the semi-conductor to form a p-type layer. The same technique may be applied to the formation of an n-type layer upon the surface of a p-type semi-conductor crystal by utilizing as a modifier a "donor" element such as antimony or arsenic.

In another of the prior art processes, a semi-conductor element is heated to form a melt and a donor impurity is added in predetermined quantities to that melt. A seed crystal is then brought into contact with the melt and recrystallization of the molten semi-conductive material is initiated. After a portion of the melt has been crystallized, an acceptor modifier is added to the melt in sufficient quantities that further crystallization of material from the melt creates a p-type crystal zone contiguous with the original n-type crystal. The process may be continued by further "doping" the melt with the donor impurity to produce an additional n-type zone; however, the process cannot be continued indefinitely because the semi-conductor melt soon contains too high a concentration of modifier elements to permit formation of useful crystals.

The third prior art technique for forming p-n junctions is somewhat similar to the second in that it comprises a crystal-growing procedure. In this third known process, however, the molten semi-conductor material, which may comprise silicon or germanium, is doped with both a donor modifier and an acceptor modifier. As before, recrystallization of the semi-conductor is initiated. In this instance, however, the rate of crystal growth is varied to determine the conductivity type of the crystal. This effect is made possible because the impurity or modifier concentration in the crystal, for different modifier elements, varies as a function of the growth rate. With proper selection of the modifier impurities and their concentrations in the melt, the conductivity of the crystallized material may be changed during crystallization by altering the growth rate of the crystal.

It is a primary object of the invention to provide a completely new and different technique for producing a single semi-conductor crystal comprising two or more contiguous zones which exhibit different types of conductivity.

It is a further object of the invention to provide a new and improved method of continuously producing semi-conductor crystals having contiguous zones of n-type and p-type conductivity.

Another object of the present invention is to provide a new and improved method of varying the impurity-modifier concentration during crystallization of a semi-conductor.

It is a corollary object of the invention to provide a new and improved method of manufacturing multi-zone semi-conductor crystals which is relatively simple and economical in operation and may be carried out by means of relatively inexpensive apparatus.

It is also an object of the present invention to provide a new and improved semi-conductor crystal growing apparatus.

In accordance with one aspect of the invention, the method of producing a semi-conductor crystal having contiguous zones of n-type and p-type conductivity suitable for use in the manufacture of junction type transistors, diodes, and similar devices comprises the following steps. A semi-conductor melt is formed by heating a mass comprising a semi-conductor element, a donor modifier and an acceptor modifier. The donor modifier employed exhibits a characteristic variation in segregation factor due to changes in the liquid-solid interface temperature gradient which is substantially different from the corresponding characteristic variation of the acceptor modifier. A portion of the melt is then crystallized while maintaining a predetermined interface temperature gradient during crystallization to produce a first semi-conductive crystal zone in which a selected one of the modifiers predominates. Subsequently, the interface temperature gradient is altered while crystallization of the material from the melt continues at approximately the same growth rate so that a second semi-conductive crystal zone, contiguous with the first zone, is produced; in this second crystal zone, the other of the two modifiers constitutes the predominant impurity. Because one of the modifiers is a donor and the other is an acceptor element, one of the two crystal zones exhibits n-type conductivity whereas the other of the two zones comprises p-type semi-conductive material.

In accordance with another aspect of the present invention, a semi-conductor crystal is produced from a melt comprising a semi-conductor element and at least one modifier; the modifier exhibits a variation in segregation factor which changes in interface temperature gradient. A first portion of the melt is crystallized at a predetermined interface temperature gradient. The latter is then altered while maintaining approximately the same growth rate as a result of which the modifier concentration is changed.

In accordance with still another aspect of the present invention, an apparatus for forming a crystal by continuing accretion to the crystal from a semi-conductor melt comprises a crucible for holding the semi-conductor material of the melt, together with means disposed adjacent the crucible for heating the material to form and maintain the melt. An inductive heating coil closely encircling the crystal is energized to heat the crystal during the progressive crystallization resulting from the continuing accretion to the crystal from the melt.

Figure 2:
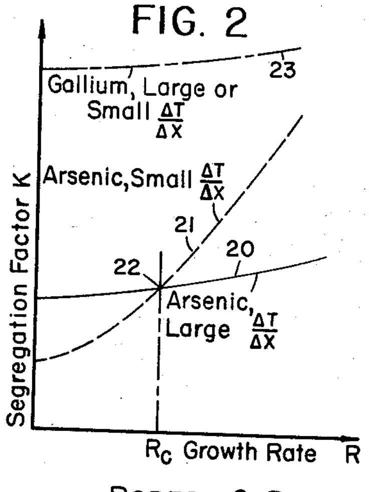
Figure 3:
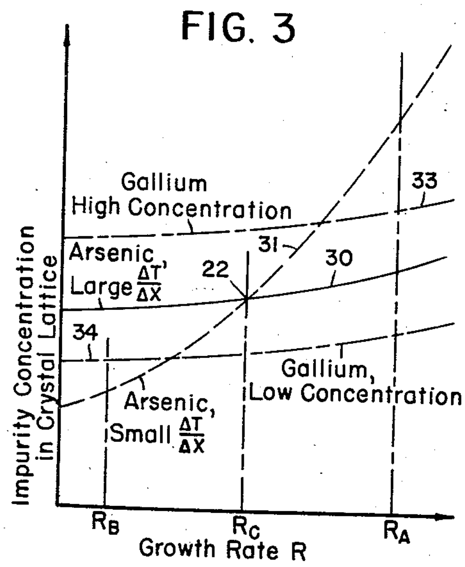

The features of the invention which are believed to be novel are set forth with particularity in the appended claims. The organization and manner of operation of the invention, together with further objects and advantages thereof, may best be understood by reference to the following description taken in conjunction with the accompanying drawings, in which:

Figure 1 is a cross-sectional view, partly schematic, of a portion of one type of apparatus suitable for use in conjunction with the inventive process;

Figure 2 is an explanatory diagram showing the effects of changes in interface temperature gradient upon the segregation factors of two specific modifier elements for a range of crystal growth rates; and Figure 3 is an explanatory diagram illustrating the effect of changes in interface temperature gradient upon the relative concentrations of the same two specific modifier elements in a crystal lattice over a range of crystal growth rates; this diagram is employed to explain the physical mechanism upon which the process is based.

The apparatus illustrated in Figure 1 is of conventional form and corresponds generally to equipment employed to manufacture semi-conductor crystals and other types of crystalline metallic material. The apparatus comprises a crucible 10 which may be constructed from quartz, graphite, or other suitable material. An inductive heating coil 11 is positioned in encompassing relation to crucible 10 and is connected to a radio-frequency power source 12.

In conventional practice, crystalline semi-conductor material is formed by first placing in the crucible a mass comprising a semi-conductor element, such as silicon or germanium, and at least one type of modifier impurity. The impurity may be of the donor type, which comprises elements from the fifth group of the periodic table, or may be of the acceptor type from group three of the table. Other impurities, such as tin, lead, etc. may be present in minor quantities. Radio-frequency energy is then applied to coil 11 from source 12 so that the semi-conductor and the modifier impurity are induction-heated to form a melt 13. Preferably, the frequency of the electrical power supplied to coil 11 is high enough that violent agitation of melt 13 is avoided.

A seed crystal 14, formed from the same semi-conductor element as the melt and of suitable size and crystal orientation, is then brought into contact with melt 13 and is subsequently withdrawn from the melt at a relatively slow speed as indicated by arrow Y. Seed crystal 14 may be held in a suitable clamp or receptacle 15, preferably formed from a material having a high thermal conductivity. As the seed crystal is withdrawn from the melt, material from the melt tends to adhere to the seed crystal because of surface tension and to crystallize as a continuation of crystal 14. The rate of withdrawal of the seed crystal and the rate of formation of crystallized material are maintained quite low (preferably ten inches per hour or less), and the temperature of the liquid-solid interface 16 between the crystallized material and melt 13 is maintained approximately at the recrystallization temperature of the semi-conductor element so that a long continuous crystal is formed by continuing accretion to crystal 14.

Because there are several different mechanisms available for immersing and withdrawing seed crystal 14 from melt 13, no specific example of this apparatus has been illustrated in the drawings. Either mechanical- or electrical-drive systems may, of course, be employed. Moreover, it will be understood that the entire process should be carried out in a vacuum or in an atmosphere comprising a gas or gases which cannot react with the semi-conductor; a hydrogen or an inert gas atmosphere has been found suitable for this purpose where germanium comprises the semi-conductor. It may be necessary to provide means for cooling the material at interface 16; jets of hydrogen have sometimes been employed for this purpose.

The technique described above has been employed in the purification of crystalline metallic material and in similar processes; a particularly advantageous and useful process of this type for the manufacture of semi-conductor crystals exhibiting uniform electrical characteristics throughout their lengths is described and claimed in the co-pending application of Robert G. Pohl, Serial No. 316,789, filed March 17, 1954, now U. S. Patent No. 2,713,042 and assigned to the same assignee as the present application. On the other hand, if two modifier impurities, one a donor and the other an acceptor, are incorporated in melt 13, the same apparatus may be employed to produce a crystal comprising a number of zones of different conductivity types by varying the rate at which seed crystal 14 is withdrawn from the melt. This process is described in an article by R. N. Hall in the journal "Physical Review" for November 1952 at page 139.

The method of the present invention preferably utilizes the general technique described in connection with the apparatus illustrated in Figure 1 to produce multi-zone semi-conductive crystls in which contiguous zones are of different conductivity types. This effect is achieved without requiring any variation in the rate of crystal growth and, therefore, without necessitating any changes in the speed at which seed crystal 14 is withdrawn from melt 13. The process of the invention utilizes variations in the segregation factors of different modifier elements resulting from changes in the temperature gradient across the liquid-solid interface 16. These characteristic variations in segregation factor with changes in interface temperatures gradient may best be understood by reference to Figure 2, in which the segregation factor $k$ for the donor element arsenic is plotted as a function of crystal growth rate R for both large and small interface temperature gradients and in which the corresponding characteristics of the acceptor modifier gallium are similiarly illustrated. The segregation factor $k$ is defined as the ratio of the concentration of the modifier element in the crystallized conductor material to the concentration of the same modifier element in the melt immediately adjacent to crystal-liquid interface 16, and is directly indicative of the concentration of the impurity in the crystal.

In Figure 2, solid line 20 illustrates the variations in the segregation factor $k$ for arsenic in germanium with the temperature gradient at the liquid-solid interface relatively large; that is, line 20 is a plot of segregation factor $k$ with respect to crystal growth rate R for arsenic in a germanium melt where the temperature of the melt is substantially higher than the recrystallization temperature of germanium (approximately 958° C.) and the temperature of crystal 14 is considerably lower than that recrystallization temperature. Under these conditions, it is seen that the segregation factor does not change greatly with variations in crystal growth rate R. Dash line 21, on the other hand, shows the changes in segregation factor $k$ for an arsenic-germanium melt where a small temperature differential exists across the liquid-solid interface. Here, with the crystal maintained at a temperature not much lower than the recrystallization temperature of the melt and with melt 13 held at a temperature only slightly higher than the recrystallization temperature, the segregation factor is initially much smaller than for a higher temperature gradient, but with increases in growth rate becomes substantially larger than for the larger gradient.

The two curves 20 and 21 intersect at an equilibrium point 22 corresponding to a growth rate $R_C$.

Line 23 in Figure 2 illustrates the variations in segregation constant *k* for gallium in a germanium melt where the temperature gradient across the crystal-liquid interface is relatively small; the same segregation factor curve is applicable over the same range of crystal growth rates with a relatively large interface temperature gradient, because the segregation factor for gallium is substantially independent of changes in growth rate and is also relatively independent of variations in the temperature gradient across the liquid-solid interface. Thus, the acceptor modifier gallium exhibits a characteristic variation in segregation factor *k* as a function of changes in the interface temperature gradient which is substantially different from the corresponding characteristic variation exhibited by the donor modifier arsenic. It is this difference which makes possible the inventive process.

In Figure 3, the concentrations of the modifier impurities arsenic and gallium in a germanium crystal are plotted as functions of growth rate R. For a given concentration of arsenic in a germanium melt, and with a small interface temperature gradient, the impurity concentration in the crystallized material is indicated by curve 31; the high-temperature-gradient arsenic concentration curve is shown by line 30. The gallium concentration in the same melt may be adjusted to provide concentrations as indicated by line 33. Of course, lines 30, 31 and 33 correspond in curvature to lines 20, 21 and 23 of Figure 2 respectively, since the modifier content of the crystallized material is a direct function of segregation factor *k*. However, the crystal impurity concentration is also a function of concentration of the modifiers in the semiconductor melt, as indicated by line 34, which shows the crystal impurity content for a lower gallium content in the melt. These curves illustrate the physical mechanism upon which the novel process for producing multi-zone semi-conductor crystals is based.

In one embodiment of this new process for manufacturing crystal junctions, seed crystal 14 is immersed in a melt comprising germanium and minute quantities of gallium and arsenic; the relative concentrations of the two modifier impurities are adjusted to provide the crystal impurity characteristics illustrated in Figure 3. Crystal 14 is slowly withdrawn from the melt and crystallization is initiated at interface 16. The rate of crystal growth is adjusted by controlling the rate at which clamp 15 and seed crystal 14 are withdrawn from the melt, the rate of withdrawal being made equal to a rate $R_A$ substantially larger than the equilibrium rate $R_C$. Initially, a relatively small temperature gradient is established across interface 16; consequently, the segregation factor for the arsenic in the melt is greater than that of the gallium and the material crystallized from melt 13 contains a higher concentration of the donor impurity arsenic than of the acceptor impurity gallium and exhibits n-type conductivity. A first semi-conductive crystal zone is formed under these conditions, after which the interface temperature gradient is increased substantially without changing the crystal growth rate $R_A$. With a large temperature gradient at the interface, as indicated by curve 30 of Figure 3, the concentration of arsenic which is solidified into the crystallized material is substantially reduced and gallium becomes the predominant impurity in the semi-conductive material formed after the change in temperature conditions. Consequently, a p-type crystal zone, contiguous with the original n-type zone, is produced as a continuation of the original crystalline structure; a p-n junction is therefore created without requiring a change in the overall impurity content of melt 13 and without requiring substantial alteration of the rate of crystal growth. The process is completely reversible; a subsequent decrease in the temperature gradient across interface 16 increases the arsenic content of the crystallized material to form an n-type zone, which may be followed by a p-type zone provided the temperature gradient is again increased during a subsequent stage in the crystallization process.

There are several ways of effecting the changes in temperature gradient across interface 16 required for operation to accordance with the invention. For example, an inductance coil 25 may be positioned in encompassing relation to crystal 14 in close proximity to interface 16 and may be connected to a radio frequency power source 26. During those portions of the crystallization process in which a relatively high temperature gradient across the interface is desired, a switch 27 in the inductance coil power line may be opened so that coil 25 is not energized and has no effect upon liquid-solid interface temperature gradient and thus does not affect the impurity content of the crystallized material. For the formation of crystal zones requiring a relatively low temperature gradient, switch 27 may be closed to energize coil 25 and inductively heat crystal 14, thereby reducing the temperature differential between the crystal and melt 13. The input power to the main R. F. coil 11 is simultaneously reduced a small amount to maintain constant crystal cross-sectional area and growth rate, and to reduce the temperature gradient in the liquid column immediately below the liquid-solid interface.

The temperature gradient across interface 16 may also be varied by the use of primary heating coil 11 alone. For a relatively high temperature gradient, the apparatus is left in the position illustrated in Figure 1 and melt 13 is heated by coil 11 and power source 12 to a temperature substantially higher than the recrystallization temperature of the semiconductor material. When a reduction in the interface temperature gradient is desired, coil 11 is moved in relation to crucible 10 as indicated by arrows Z to the position shown by dash outline 11' in which a portion of crystal 14 is heated by the inductive field of the coil. This procedure effectively reduces the temperature differential between the crystal and the melt and may be employed to effect a change in the conductivity type of the material crystallized from the melt.

Merely by way of illustration, and in no sense by way of limitation, it may be helpful to review the development of equations which may be utilized to calculate the desired quantities of impurities to be added to melt 13 in carrying out the present invention. For this purpose, let $k_{as+}$ represent the segregation factor of arsenic at a large temperature gradient and $k_{as-}$ represent the segregation factor of arsenic at a low temperature gradient; similarly, let $k_{ga}$ represent the segregation factor for gallium, which has substantially the same segregation factor at both large and small temperature gradients.

As a first illustration, assume operation at the higher growth rate $R_A$, that is, at a growth rate above the equilibrium rate $R_C$. The initial parameters are the desired conductivities in the *p* and *n* regions; these are represented by $\sigma_p$ and $\sigma_n$, respectively. These conductivities are related to the number of donors and acceptors and other physical constants by the relations (1) $$\sigma_n = ne\mu_n$$

(2) $$\sigma_p = pe\mu_p$$

wherein *n* is the number of conduction electrons per unit volume, *p* is the number of holes per unit volume, *e* is the electronic charge ($1.6 \times 10^{-19}$ coulomb), $\mu_n$ is the electron mobility $$\frac{(3600\text{ cm.}^2)}{\text{volt-sec.}}$$

and $\mu_p$ is the hole mobility $$\left[1700\frac{\text{cm.}^2}{\text{volt-sec.}}\right]$$

The number of holes and electrons available for conduction can be considered to be due predominately to the donors and acceptors present, from which $$(3) \qquad n=(N_{d,n})-(N_{a,n})$$

$$(4) \qquad p=(N_{a,p})-(N_{d,p})$$

in which $N_{d,n}$=number of donors in the n region
$N_{d,p}$=number of donors in the p region
$N_{a,n}$=number of acceptors in the n region
$N_{a,p}$=number of acceptors in the p region Since the segregation factor of the acceptor element gallium is substantially independent of temperature gradient, $$(5) \qquad N_{a,n}=N_{a,p}$$

Assuming complete mixing, the number of donors crystallizing out in the two regions is related to the number of donors in the melt by the following equations $$(6) \qquad N_{d,n}=(k_{as-})\cdot(N_{as,m})$$

$$(7) \qquad N_{d,p}=(k_{as+})\cdot(N_{as,m})$$

where $N_{as,m}$ is the concentration of arsenic in the melt. Similarly, for the acceptors $$(8) \qquad N_{a,n}=N_{a,p}=(k_{ga})\cdot(N_{ga,m})$$

where $N_{ga,m}$ is the concentration of gallium in the melt. Substituting Equations 6, 7, and 8 into Equations 3 and 4, $$(9) \qquad n=(k_{as-})(N_{as,m})-(k_{ga})(N_{ga,m})=\frac{\sigma_n}{e\mu_n}$$

$$(10) \qquad p=(k_{ga})(N_{ga,m})-(k_{as+})(N_{as,m})=\frac{\sigma_p}{e\mu_p}$$

Equations 9 and 10 constitute two equations in two unknowns ($N_{as,m}$ and $N_{ga,m}$) and, hence, an explicit solution is obtained by adding (9) and (10):

$$(11) \qquad (k_{as-})(N_{as,m})-(k_{as+})(N_{as,m})=\frac{\sigma_n}{e\mu_n}+\frac{\sigma_p}{e\mu_p}$$

or $$N_{as,m}=\frac{1}{(k_{as-})-(k_{as+})}\left\{\frac{\sigma_n}{e\mu_n}+\frac{\sigma_p}{e\mu_p}\right\}$$

Then, substituting Equation 11 in Equation 10, $$(12) \qquad N_{ga,m}=\frac{1}{k_{ga}}\left\{\frac{\sigma_p}{e\mu_p}+\frac{k_{as+}}{(k_{as-})-(k_{as+})}\left[\frac{\sigma_n}{e\mu_n}+\frac{\sigma_p}{e\mu_p}\right]\right\}=\frac{1}{k_{ga}}\left\{\frac{k_{as+}}{\Delta k_{as}}\frac{\sigma_n}{e\mu_n}+\frac{k_{as-}}{\Delta k_{as}}\frac{\sigma_p}{e\mu_p}\right\}$$

where $\Delta k_{as}=(k_{as-})-(k_{as+})$

Equations 11 and 12 are the important practical equations of interest, since, simply by inserting the proper numbers in them, the doping concentrations in the melt are immediately obtained.

With a growth rate $R_A$ of approximately 1¾ in. per hour, segregation factor $k_{as+}$ at a temperature gradient of 100° C./cm. has been found to be approximately 0.058. For the same growth rate, segregation factor $k_{as-}$ at a temperature gradient of 10° C./cm. has been found to be approximately 0.072. The segregation factor $k_{ga}$ for either temperature gradient has been found to be approximately 0.11. Assuming desired conductivities of $\sigma_n=1$ *and* $\sigma_p=.1$ (ohm—cm.)$^{-1}$, and utilizing the other values given above, the quantities of gallium and arsenic obtained from Equations 11 and 12 are, $$N_{as,m}=1.51\times10^{17}\ \frac{\text{atoms}}{\text{cc.}}$$

$$N_{ga,m}=8.25\times10^{16}\ \frac{\text{atoms}}{\text{cc.}}$$

With a known mass M of germanium in the melt, its volume V is obtained by dividing the mass by its density $\rho$ (5.34 gm./cc.); thus, $$(13) \qquad V=\frac{M}{\rho}$$

For a typical melt containing 125 gm. of germanium, its volume as given by Equation 13 is 23.4 cc.

The required mass of impurity required for the melt may be obtained from the equation $$(14) \qquad M_{imp.}=\frac{(N_{imp.})(V)(W_{imp.})K}{A}$$

where $M_{imp.}$ is the mass of the impurity required, $N_{imp.}$ is the quantity of impurity in atoms/cc. as determined from Equations 11 and 12, V is the volume of melt as determined from Equation 13, $W_{imp.}$ is the atomic weight of the impurity, A is Avogradro's number ($6.02\times10^{23}$); and K is a constant which may be termed the evaporation factor.

Substitution of the values obtained from Equations 11, 12 and 13 for the conditions above specified, and with $K=1$, into Equation 14 yields the required masses of the impurities; the amounts required in this instance are 0.44 milligram of arsenic and 0.23 milligram of gallium. These figures represent the theoretical amounts of impurities necessary to obtain the specified conductivities under the condition cited. However, constant K is incapable of being incorporated directly into the theoretical computations in advance of an initial trial run, because it depends entirely on the equipment utilized; both impurities are subject to evaporation during the crystallization process as a result of which it is usually necessary to add much more impurity than would appear from the equations. For an impurity material having a relatively low melting point, it will, of course, require proportionally more additional material than that required for a material having a relatively high melting point. However, the above equations are useful to establish a starting point. In present day conventional crystal growing apparatus, it usually required from 100 to 500 times more arsenic than is given by Equation 14, while it requires 500 to 1000 times more gallium than is given by Equation 14, gallium having the lower melting point temperature of the two. Thus, if constant K in Equation 14 is given a value of 250 in the case of arsenic, and is given a value of 750 in the case of gallium, the process of the present invention carried out under the above specified conditions results in the production of p-n junctions having approximately the specified conductivities. It then is necessary only to measure the actual conductivities of the first sample produced from which the amount of any error is determined; it is then a simple matter to make an adjustment in the amount of impurities added to the melt, the change of amount added being directly proportional to the amount of error in the conductivities of the sample.

In carrying out this typical embodiment of the present invention, 125 grams of germanium is heated in an argon atmosphere in crucible 10 which may be either fused quartz or high purity graphite to a temperature of approximately 1000° C., which is about 42° higher than the melting point of the germanium. Seed crystal 14 is then lowered into contact with germanium melt 13 to form interface 16; the crystal is of high purity (resistivity more than 20 ohm cm.) germanium material and has a cross-sectional area at the interface of about 0.05 in.$^2$. As the crystal is subsequently drawn upwardly at a rate of approximately 1¾ in. per hour, the temperature of the melt is lowered to 978° C. so that the area of crystal being pulled is about 0.4 in.$^2$. The seed crystal is rotated at about 100 R. P. M. to stir the melt, and produce more uniform recrystallization. Approximately 110 milligrams of arsenic and 171 milligrams of gallium are quickly added to the germanium melt by releasing pellets from glass brackets positioned above the crucible, these amounts include a multiplying factor to compensate for evaporation of the impurities. When switch 27 is closed to energize coil 25, the temperature gradient at interface 16 is approximately 10° C./cm., whereupon a zone is formed having predominantly n-type conductivity since the segregation factor of arsenic in the melt is greater than that of gallium under these conditions. Subsequently, switch 27 is opened to remove power from coil 25 after which the temperature gradient across interface 16 rises to about 100° C./cm. because of the cooling of the growing crystal by the incoming argon by conduction losses through the seed crystal and the supporting rod and by radiation; gallium then becomes the predominant impurity in the semi-conductor material formed and, consequently, a p-type zone, contiguous with the original n-type zone, is produced. The temperature of the melt and of the growing crystal can be determined with a chromel-alumel thermocouple or by a standard radiation pyrometer. If the latter is utilized, the observed temperature must be corrected since germanium is not a true black body. A table of this correction is given in an article by T. R. Harrison, Journal of the Optical Society of America 35, 715 (Nov. 1945). The spectral emittance at a wavelength of 6500 Angstroms for germanium at the melting point was determined to be $E_L=.24\pm.01$ for the liquid state and $E_S=.29\pm.01$ for the solid state. With these corrections, the proper temperature gradient is readily established by measuring temperatures and by adjusting the power input to coil 25 accordingly.

Figure 3 also indicates another mode of operation for the inventive process using the same donor and acceptor impurities. In this embodiment, the arsenic concentration is adjusted to provide the same crystal impurity characteristics, indicated by curves 30 and 31, as in the previously-described process. The gallium concentration in this melt, however, is made substantially lower to provide a crystal impurity characteristic as indicated by line 34. In this embodiment of the inventive process, the rate of crystal growth is established at a value $R_B$ substantially lower than the equilibrium rate $R_C$ for arsenic. In this instance, if the temperature gradient during the initial stage of crystallization is relatively small, the material crystallized includes a higher concentration of gallium than arsenic; because gallium is an acceptor modifier, the crystal zone formed is of p-type conductivity. The interface temperature gradient may then be increased substantially; as a result, the predominant impurity in the material crystallized subsequent to the change in temperature gradient is the donor arsenic, and a zone of n-type semi-conductor crystal is produced.

As a typical example of carrying out the process of the invention at growth rate $R_B$ which is less than equilibrium $R_c$, a pulling rate of ½ in. per hour is employed. For such growth rate, it has been determined that the segregation factor $k_{as+}$ of arsenic at a temperature gradient of 100° C./cm. is approximately 0.037, while the segregation factor $k_{as-}$ for arsenic at 10° C./cm. is about 0.025. For gallium, the segregation factor $k_{ga}$ still is approximately 0.11 at this growth rate.

The effect of operating at a growth rate $R_B$ less than the equilibrium growth rate $R_C$ is to change Equations 6 and 7 to read $$N_{d,n}=(k_{as+})(N_{as,m}) \tag{15}$$

$$N_{d,p}=(k_{as-})(N_{as,m}) \tag{16}$$

or essentially to interchange the subscripts on $k_{as}$. Since the algebraic solution is identical to that given before, the answer is obtained simply by interchanging subscripts on the previous equations. Therefore, Equations 11 and 12 become $$N_{as,m}=\frac{1}{\Delta k_{as}}\left\{\frac{\sigma_n}{e\mu_n}+\frac{\sigma_p}{e\mu_p}\right\} \tag{17}$$

$$N_{Ga,m}=\frac{1}{k_{Ga}}\left\{\frac{k_{as-}}{\Delta k_{as}}\frac{\sigma_n}{e\mu_n}+\frac{k_{as+}}{\Delta k_{as}}\frac{\sigma_p}{e\mu_p}\right\} \tag{18}$$

where now $\Delta k_{as}=(k_{as+})-(k_{as}-)$.

Under this set of operating conditions, the values for the doping concentrations in the melt are $$N_{as,m}=1.75\times10^{17}\ \frac{\text{atoms}}{\text{cc.}}$$

$$N_{Ga,m}=4.32\times10^{16}\ \frac{\text{atoms}}{\text{cc.}}$$

Inserting these quantities individually into Equation 14 for the 125 gram melt of germanium, the theoretical amount of arsenic required for $K=1$ is 0.51 milligram and the amount of gallium required is 0.12 milligram. Again, evaporation factor K must be experimentally determined for the particular apparatus utilized; with conventional apparatus, this evaporation factor is in the range indicated above for the 1¾ in. per hour conditions.

It will be apparent that Equations 11 and 12 or Equations 17 and 18 may be utilized for any desired donor and acceptor impurity materials. It will almost always be necessary to first make an experimental crystal and then to measure its actual conductivities in order to determine the precise amount of impurity material that must be added to the melt for any one particular equipment set-up. However, once the correct proportions are determined, the process is capable of being carried out continuously without the need for further experimentation; it is but a simple matter of normal quality control procedure to maintain accurate control of the conductivities in regular production.

The inventive method for manufacturing multi-zone semi-conductor crystals is readily adaptable to a continuous process. In order to crystallize material from melt 13 indefinitely, it is only necessary to continuously introduce molten semi-conductor material into crucible 10 at a rate approximately equal to the loss of material from the melt due to crystallization at interface 16. Indefinite continuation of the crystallization process will, of course, require the introduction of further quantities of the donor and acceptor impurities into the melt; however, since the segregation factors for these impurities are usually extremely small (of the order of 0.1 to 0.001), crystallization may be continued for a considerable period without requiring any further "doping" of the melt. Because the crystal growth rate is maintained essentially constant throughout the crystallization process, regulation of the amount of semi-conductor material added to melt 13 is considerably simplified. In addition, because the concentration of donor and modifier impurities tends to diminish rather than to increase, there is no danger of over-concentration of modifier impurities in the melt which would render the crystallized material relatively valueless for use in electrical devices such as diodes and transistors.

The apparatus required for the inventive method of crystallizing semi-conductive material is relatively simple and, in fact, is not substantially different from the apparatus employed in prior art processes. For continuous operation of the process, crucible 10 should be relatively large in volume as compared to the volume of crystal material produced, in order to prevent an overconcentration of modifier impurities in the melt if the rate of addition of the semi-conductor material falls slightly below the rate of crystallization. Ideally, crucible 10 should have a volume great enough that melt 13 in effect appears as an infinite source of semi-conductive material.

Although the impurity content of the semi-conductor melt is subject to considerable variation, depending upon the resistivity desired in the crystal material, the segregation factor, the number and amount of other impurities present in the melt, the growth rate desired, and many other factors, it may be noted that for arsenic and gallium in a germanium melt the concentration is of the order of $10^{17}$ modifier atoms per cubic centimeter of germanium. Other semi-conductor and modifier elements may be substituted in the process without materially changing its operation so long as the characteristic variation in segregation factor with changes with interface temperature gradient is substantially different for the two modifier elements in the particular semi-conductor element employed. At present, there appears to be no theoretical method for predicting the effect of changes in interface temperature gradient upon different modifier impurities in either germanium or silicon. Rather, the characteristics of the modifier elements must be determined empirically. However, each modifier element may be tested individually in the semi-conductor material with which it is to be employed; there is no necessity for redetermining this factor for each modifier in combination with any other modifier, since the process is a physical one and the presence of one modifier impurity does not substantially alter the segregation characteristics of the other.

While particular embodiments of the present invention have been shown and described, it is apparent that changes and modifications may be made without departing from the invention in its broader aspects. The aim of the appended claims, therefore, is to cover all such changes and modifications as fall within the true spirit and scope of the invention.

I claim:

1. In the manufacture of junction-type transistors, diodes, and similar devices, the method of producing a semi-conductor crystal having contiguous zones of n-type and p-type conductivity comprising the following steps: heating a mass comprising a semi-conductor element, a donor modifier, and an acceptor modifier to form a melt, said donor modifier exhibiting a characteristic variation in segregation factor with changes in interface temperature gradient which is substantially different from the corresponding characteristic variation of said acceptor modifier; crystallizing a portion of said melt at predetermined rates of crystallization and interface velocity while maintaining a predetermined interface temperature gradient to produce a first semi-conductive crystal zone in which a selected one of said modifiers is the predominant impurity; and subsequently altering said interface temperature gradient while continuing to crystallize material from said melt at approximately the same rates of crystallization and interface velocity to produce a second semi-conductive crystal zone, contiguous with said first zone, in which the other of said modifiers is the predominant impurity.

2. In the manufacture of junction-type transistors, diodes, and similar devices, the method of producing a semi-conductor crystal having contiguous zones of n-type and p-type conductivity from a melt comprising a semi-conductor element, a donor modifier, and an acceptor modifier, said donor modifier exhibiting a characteristic variation in segregation factor with changes in interface temperature gradient which is substantially different from the corresponding characteristic variation of said acceptor modifier, said method comprising the following steps: crystallizing a portion of said melt at predetermined rates of crystallization and interface velocity while maintaining a predetermined interface temperature gradient to produce a first semi-conductive crystal zone in which a selected one of said modifiers is the predominant impurity; altering said interface temperature gradient while continuing to crystallize material from said melt to produce a second semi-conductive crystal zone, contiguous with said first zone, in which the other of said modifiers is the predominant impurity; and concurrently with altering of said interface temperature gradient altering in the same sense the temperature of the portion of said melt immediately adjacent said interface to alter the temperature gradient in said portion in order to maintain a constant cross-sectional area of crystallization by maintaining approximately the same rates of crystallization and interface velocity.

3. In the manufacture of junction-type transistors, diodes, and similar devices, the method of producing a semi-conductor crystal having contiguous zones of n-type and p-type conductivity comprising the following steps: heating a mass comprising a semi-conductor element, a donor modifier, and an acceptor modifier to form a melt, said donor modifier exhibiting a characteristic variation in segregation factor with changes in interface temperature gradient which is substantially different from the corresponding characteristic variation of said acceptor modifier; crystallizing a portion of said melt at predetermined rates of crystallization and interface velocity while maintaining a predetermined interface temperature gradient to produce a first semi-conductive crystal zone in which a selected one of said modifiers is the predominant impurity; and heating a portion of said first crystal zone to decrease said interface temperature gradient while continuing to crystallize material from said melt at approximately the same rates of crystallization and interface velocity to produce a second semi-conductive crystal zone, contiguous with said first zone, in which the other of said modifiers is the predominant impurity.

4. In the manufacture of junction-type transistors, diodes, and similar devices, the method of producing a semi-conductor crystal having contiguous zones of n-type and p-type conductivity comprising the following steps: continuously heating a mass comprising a semi-conductor element, a donor modifier, and an acceptor modifier to form a melt, said donor modifier exhibiting a characteristic variation in segregation factor with changes in interface temperature gradient which is substantially different from the corresponding characteristic variation of said acceptor modifier; crystallizing a portion of said melt at predetermined rates of crystallization and interface velocity while maintaining a predetermined interface temperature gradient to produce a first semi-conductive crystal zone of predetermined cross-sectional area in which a selected one of said modifiers is the predominant impurity; and heating a portion of said first crystal zone while decreasing the heat applied to said melt to decrease said interface temperature gradient while continuing to crystallize material from said melt at approximately the same rates of crystallization and interface velocity to produce a second semi-conductive crystal zone and having a cross-sectional area substantially equal to said predetermined cross-sectional area, contiguous with said first zone, in which the other of said modifiers is the predominant impurity.

5. The method of producing a semi-conductor crystal comprising the following steps: heating a mass comprising a semi-conductor element and at least one modifier impurity to form a melt, said modifier impurity exhibiting a characteristic variation in segregation factor with changes in interface temperature gradient; crystallizing a portion of said melt at predetermined rates of crystallization and interface velocity while maintaining a predetermined interface temperature gradient to produce a first semi-conductive crystal zone having a predetermined concentration of said modifier impurity; and heating a portion of said first crystal zone to decrease said interface temperature gradient while continuing to crystallize material from said melt at approximately the same rates of crystallization and interface velocity to produce a second semi-conductive crystal zone contiguous with said first zone and having a different concentration of said modifier impurity.

6. The method defined in claim 5 in which the cross-sectional area of crystallization is maintained constant by reducing the temperature of the portion of said melt immediatelly adjacent said interface concurrently with said heating of said first crystal zone in order to maintain said same rates of crystallization and interface velocity.

7. The method of producing a semi-conductor crystal comprising the following steps: heating a mass comprising a semi-conductor element and at least one modifier impurity to form a melt, said modifier impurity exhibiting a characteristic variation in segregation factor with changes in interface temperature gradient; crystallizing a portion of said melt at predetermined rates of crystallization and interface velocity while maintaining a predetermined interface temperature gradient to produce a first semi-conductive crystal zone having a predetermined concentration of said modifier impurity; altering said interface temperature gradient while continuing to crystallize material from said melt to produce a second semi-conductive crystal zone contiguous with said first zone and having a different concentration of said modifier; and concurrently with said altering of said interface temperature gradient altering in the same sense the temperature of the portion of said melt immediately adjacent said interface to alter the temperature gradient in said portion in order to maintain a constant cross-sectional area of crystallization by maintaining approximately the same rates of crystallization and interface velocity.

8. In an apparatus for forming a crystal from a melt of semi-conductor material by continuing accretion to the crystal to progressively crystallize increments of the material at the interface between the melt and the crystal; a crucible for holding said semi-conductor material; means disposed adjacent said crucible for heating said material to form and maintain said melt; an inductive heating coil closely encircling the crystal; and means for energizing said heating coil to heat said crystal during said progressive crystallization.

References Cited in the file of this patent

UNITED STATES PATENTS

| | | |
|---|---|---|
| 2,739,088 | Pfann | Mar. 20, 1956 |
| 2,768,914 | Buehler | Oct. 30, 1956 |
| 2,792,317 | Davis | May 14, 1957 |